United States Patent
Tabatowski-Bush et al.

(10) Patent No.: US 9,931,960 B2
(45) Date of Patent: Apr. 3, 2018

(54) ELECTRIC OR HYBRID VEHICLE BATTERY PACK VOLTAGE MEASUREMENT FUNCTIONAL ASSESSMENT AND REDUNDANCY

(71) Applicant: Ford Global Technologies, LLC, Dearborn, MI (US)

(72) Inventors: Benjamin A. Tabatowski-Bush, South Lyon, MI (US); Michael Edward Loftus, Northville, MI (US); Xu Wang, Northville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 14/851,254

(22) Filed: Sep. 11, 2015

(65) Prior Publication Data

US 2017/0072811 A1      Mar. 16, 2017

(51) Int. Cl.
*B60L 11/18*     (2006.01)

(52) U.S. Cl.
CPC ....... *B60L 11/1864* (2013.01); *B60L 11/1861* (2013.01)

(58) Field of Classification Search
CPC .................................. B60L 11/1851–11/1879
See application file for complete search history.

(56) References Cited

U.S. PATENT DOCUMENTS

| | | | |
|---|---|---|---|
| 7,212,006 B2* | 5/2007 | Huang | G01R 31/3662 324/430 |
| 9,007,066 B2 | 4/2015 | Sufrin-Disler et al. | |
| 2009/0295401 A1* | 12/2009 | Kamata | G01R 31/006 324/509 |
| 2011/0276295 A1 | 11/2011 | Gaben et al. | |
| 2013/0119941 A1* | 5/2013 | Moorhead | G01R 31/3648 320/136 |
| 2013/0300426 A1 | 11/2013 | Butzmann | |
| 2013/0320988 A1 | 12/2013 | Feuchter et al. | |
| 2014/0015536 A1 | 1/2014 | Butzmann et al. | |
| 2014/0183941 A1* | 7/2014 | Bae | B60L 3/0069 307/10.1 |
| 2014/0349157 A1 | 11/2014 | Lang | |
| 2015/0015267 A1 | 1/2015 | Mueller et al. | |
| 2015/0028879 A1 | 1/2015 | Butzmann | |

FOREIGN PATENT DOCUMENTS

DE          102010038886 A1     2/2012

* cited by examiner

*Primary Examiner* — Genna M Mott
(74) *Attorney, Agent, or Firm* — David B. Kelley; Brooks Kushman P.C.

(57) ABSTRACT

Systems and methods for measuring voltage of a battery pack for an electrified vehicle, such as an electric or hybrid vehicle, include a battery having internal circuits that measure pack voltage and individual cell voltages, an electric machine powered by the battery to propel the vehicle via an external circuit that measures the pack voltage, and a processor programmed to publish the pack voltage to a vehicle network based on a first internal circuit voltage in response to a voltage differential among the internal circuits being less than a threshold and based on the individual cell voltages otherwise. The published pack voltage may be used by one or more battery or vehicle controllers to control various battery and vehicle functions including engine starting in a hybrid vehicle and battery charging and discharging, for example.

19 Claims, 5 Drawing Sheets

ELECTRIC OR HYBRID VEHICLE BATTERY PACK VOLTAGE MEASUREMENT FUNCTIONAL ASSESSMENT AND REDUNDANCY

TECHNICAL FIELD

Aspects of the present disclosure relate to systems and methods for ensuring proper functioning and backup redundancy of battery pack voltage measurements for electrified vehicles, such as electric and hybrid vehicles.

BACKGROUND

Electrified vehicles, such as electric and hybrid vehicles, include a battery pack, also referred to as a traction battery or traction battery pack, and an electric machine to propel the vehicle. Hybrid vehicles include an internal combustion engine that may be used to charge the battery pack and/or propel the vehicle in combination with the electric machine. The traction battery pack includes multiple individual battery cells connected to one another to provide power to the vehicle. A Battery Management System (BMS) in electrified vehicles measures voltage of the traction battery pack as well as individual cell voltages. Various high voltage (HV) modules or circuits may be powered by the battery pack and may communicate with the BMS over a vehicle network. Battery pack voltage is often used in many aspects of vehicle and battery control, e.g. battery online power capability estimation, cell balancing, battery overcharge and overdischarge protection, engine cranking availability determination (in hybrid vehicles), battery end of life judgment, current leakage measurement, contactor status determination, battery charging, etc.

One or more industry functional specifications or standards may apply to certain functions of a BMS or related components and circuits. Vehicles may include self-diagnostics and in some cases redundancy for various BMS-related components or functions to meet a particular standard or achieve a particular rating published by a standards committee or rating agency.

SUMMARY

In one or more embodiments, a vehicle may include a traction battery pack having a high voltage bus and a plurality of individual battery cells, the traction battery pack including a plurality of internal circuits that provides a corresponding plurality of independent internal measurements of traction battery pack voltage. The vehicle may also include a plurality of external circuits external to the traction battery pack and coupled to the high voltage bus providing a corresponding plurality of independent external measurements of the traction battery pack voltage. An electric machine powered by the traction battery pack via one of the plurality of external circuits to propel the vehicle communicates with a controller in communication with the plurality of internal circuits and the plurality of external circuits and programmed to publish a pack voltage to a vehicle network. The pack voltage corresponds to a first independent internal measurement in response to a voltage differential among all of the independent internal measurements being less than a threshold, a second independent internal measurement in response to the voltage differential exceeding the threshold, and a statistical measure of the independent internal and external measurements in response to any of the internal measurements being invalid. The external circuits may include an inverter circuit, an electric air conditioning (eAC) circuit, and a DC/DC converter circuit that may publish or broadcast associated independent external voltage measurements. The internal circuits may include a battery pack voltage measuring circuit that measures traction battery pack voltage across the plurality of individual battery cells. In one embodiment, the internal circuits include a plurality of battery monitoring integrated circuits each measuring voltage across a corresponding group of the individual battery cells.

Various embodiments may include a vehicle having a battery with internal circuits that measure pack voltage and individual cell voltages, an electric machine powered by the battery to propel the vehicle via an external circuit that measures the pack voltage, and a processor programmed to publish the pack voltage based on a first internal circuit voltage in response to a voltage differential among the internal circuits being less than a threshold and based on the individual cell voltages otherwise. The internal circuits may include a positive branch leakage detection circuit measuring the traction battery pack voltage from a most positive of the individual battery cells to vehicle ground and a negative branch leakage detection circuit measuring the traction battery pack voltage from a most negative of the individual battery cells to vehicle ground. The vehicle may also include a second external circuit that measures the pack voltage with the processor further programmed to publish the pack voltage based on a statistical measure of central tendency of the pack voltage measurements from the internal circuits and the external circuits. The vehicle processor may be programmed to store a diagnostic code in response to a voltage difference among the external circuits exceeding a second threshold, and may be programmed to publish the pack voltage based on a median value of the pack voltage measurements from the internal circuits and the external circuits in response to a voltage difference among the external circuits being below the second threshold.

One or more embodiments include a control method for an electric vehicle having a traction battery coupled to an electric machine with a vehicle processor outputting a pack voltage to a vehicle network based on internal voltage measurements in response to a voltage differential among the internal measurements being less than a threshold, and outputting the pack voltage based on a statistical function of the internal measurements and published voltage measurements from external circuits otherwise. The control method may include use of a statistical measure of central tendency, such as a median value, and/or summing of internal measurements associated with individual battery cells. In one embodiment, the statistical function includes a median of the internal voltage measurements and the published voltage measurements from the external circuits in response to a voltage differential of the published voltage measurements from the external circuits being below an associated threshold.

Embodiments according to the present disclosure may provide one or more advantages. For example, embodiments according to the present disclosure may provide a functional assessment of the validity of battery pack voltage measurements using measurements from internal and/or external circuits. In addition, embodiments may provide a reliable indication of battery pack voltage when the functional assessment indicates one or more of the internal or external circuits is not functioning as expected. Various embodiments provide self-diagnosis using the functional assessments described herein in combination with redundancy to provide a backup battery voltage measurement for use in controlling the battery and/or vehicle.

DETAILED DESCRIPTION

Figure 1:
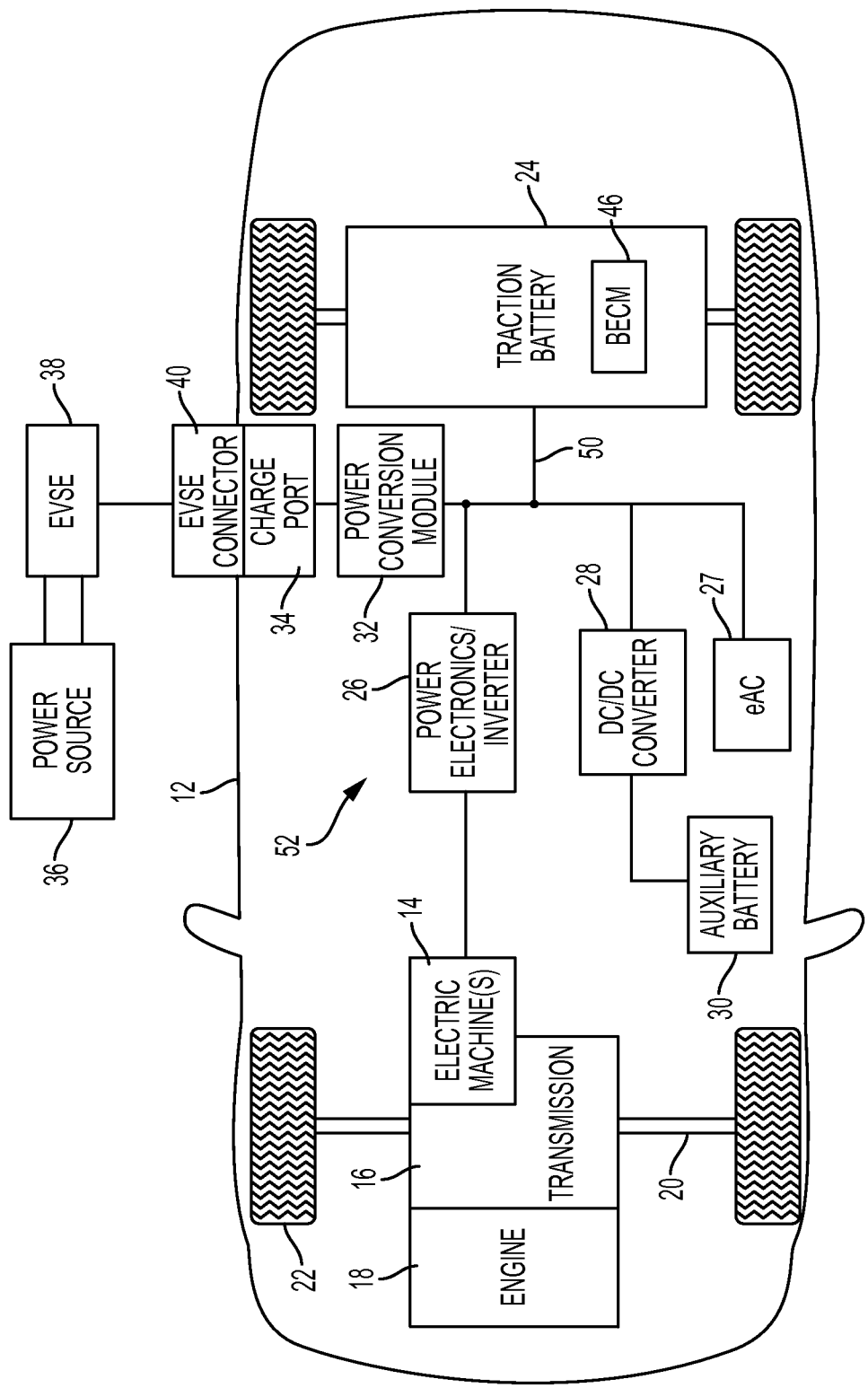
FIG. 1 is a block diagram of a representative electric vehicle having a vehicle processor or controller that controls the battery and/or vehicle using a published battery pack voltage based on a functional assessment of internal and external voltage measurements according to embodiments of the present disclosure.

As required, detailed embodiments are disclosed herein; however, it is to be understood that the disclosed embodiments are merely representative of the claimed subject matter and may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

The embodiments of the present disclosure generally provide for a plurality of internal and external circuits or other electrical devices. All references to the circuits and other electrical devices and the functionality provided by each, are not intended to be limited to encompassing only what is illustrated and described herein. While particular labels may be assigned to the various circuits or other electrical devices disclosed, such labels are not intended to limit the scope of operation for the circuits and the other electrical devices. Such circuits and other electrical devices may be combined with each other and/or separated in any manner based on the particular type of electrical implementation that is desired. It is recognized that any circuit or other electrical device disclosed herein may include any number of discrete passive and active components such as resistors, capacitors, transistors, amplifiers, analog/digital converters (ADC or A/D converters), microprocessors, integrated circuits, non-transitory memory devices (e.g., FLASH, random access memory (RAM), read only memory (ROM), electrically programmable read only memory (EPROM), electrically erasable programmable read only memory (EEPROM), or other suitable variants thereof) and software which cooperate with one another to perform operation(s) disclosed herein. In addition, any one or more of the electric devices may be configured to execute a computer program that is embodied in a non-transitory computer readable storage medium that includes instructions to program a computer or controller to perform any number of the functions as disclosed. As used herein, internal circuits generally refer to circuits having components within the battery pack and external circuits generally refer to circuits or modules powered by the battery pack, but located inside the vehicle and outside of the battery pack.

FIG. 1 is a block diagram of a representative electric vehicle having a vehicle processor or controller that controls the vehicle using a published battery pack voltage based on voltage measurements from internal and/or external battery circuits or modules according to embodiments of the present disclosure. While a plug-in hybrid vehicle having an internal combustion engine is illustrated in this representative embodiment, those of ordinary skill in the art will recognize that the disclosed embodiments may also be implemented in a conventional hybrid vehicle, an electric vehicle, or any other type of vehicle having a battery pack with individual battery cells used to propel the vehicle under at least some operating conditions.

A plug-in hybrid-electric vehicle 12 may include one or more electric machines 14 mechanically connected to a hybrid transmission 16. The electric machines 14 may be capable of operating as a motor or a generator. For hybrid vehicles, a transmission 16 is mechanically connected to an internal combustion engine 18. The transmission 16 is also mechanically connected to a drive shaft 20 that is mechanically connected to the wheels 22. The description herein is equally applicable to a battery electric vehicle (BEV), where the hybrid transmission 16 may be a gear box connected to an electric machine 14 and the engine 18 may be omitted as previously described. The electric machines 14 can provide propulsion and deceleration capability whether or not the engine 18 is operating. The electric machines 14 also act as generators and can provide fuel economy benefits by recovering energy that would normally be lost as heat in the friction braking system. The electric machines 14 may also reduce vehicle emissions by allowing the engine 18 to operate at more efficient speeds and allowing the hybrid-electric vehicle 12 to be operated in electric mode with the engine 18 off under certain conditions. Similar advantages may be obtained with an electric vehicle that does not include an internal combustion engine 18.

A traction battery or traction battery pack 24 stores energy in a plurality of individual battery cells connected together that can be used by the electric machines 14. Vehicle battery pack 24 typically provides a high voltage DC output to a high voltage bus 50, although the voltage and current may vary depending on particular operating conditions and loads. The traction battery pack 24 is electrically connected to one or more external circuits 52, which may include a power electronics or inverter circuit 26, an electric air conditioning (eAC) circuit 27, a DC/DC converter circuit 28 and/or a power conversion module or circuit 32, for example. One or more contactors (best shown in FIGS. 2-3) may isolate the traction battery pack 24 from other components when opened, and connect the traction battery pack 24 to the other components when closed. As described in greater detail herein, various internal voltage measurement circuits may provide independent battery pack voltage measurements depending on which contactors are open or closed. The power electronics or inverter circuit 26 is also electrically connected to the electric machines 14 and provides the ability to bi-directionally transfer energy between the traction battery pack 24 and the electric machines 14. For example, a typical traction battery pack 24 may provide a DC voltage while the electric machines 14 may require a three-phase AC voltage or current to function efficiently. The power electronics or inverter circuit 26 may convert the DC voltage to a three-phase AC current supplied to the electric machines 14. In a regenerative mode, the power electronics or inverter circuit 26 may convert the three-phase AC current from the electric machines 14 acting as generators to the DC voltage supplied to the traction battery pack 24.

In addition to providing energy for propulsion, the traction battery pack 24 may provide energy for other external circuits 52 connected to the high voltage bus 50 as previously described. Vehicle 12 may include a compressor (not shown) powered by traction battery 24 via an associated electric air conditioning (eAC) module or circuit 27 to condition the vehicle cabin and/or traction battery 24. Vehicle 12 may also include a DC/DC converter module or circuit 28 that converts the high voltage DC output of the traction battery 24 to a low voltage DC supply that is compatible with other vehicle loads. Other external high voltage circuits or loads, such as those for cabin or component heaters, may be connected directly to the high voltage bus 50 without the use of a DC/DC converter module 28. The low-voltage systems may be electrically connected to an auxiliary battery 30 (e.g. a 12V, 24V, or 48V battery).

Embodiments of this disclosure may include vehicles such as vehicle 12, which may be a hybrid or range-extender hybrid, or an electric vehicle or a plug-in hybrid vehicle in which the traction battery pack 24 may be recharged by an external power source 36. The external power source 36 may be a connection to an electrical outlet connected to the power grid. The external power source 36 may be electrically connected to electric vehicle supply equipment (EVSE) 38. The EVSE 38 may provide circuitry and controls to regulate and manage the transfer of energy between the power source 36 and the vehicle 12. The external power source 36 may provide DC or AC electric power to the EVSE 38. The EVSE 38 may have a charge connector 40 for plugging into a charge port 34 of the vehicle 12. The charge port 34 may be any type of port configured to transfer power from the EVSE 38 to the vehicle 12. The charge port 34 may be electrically connected to a charger or on-board power conversion module 32. The power conversion module 32 may condition the power supplied from the EVSE 38 to provide the proper voltage and current levels to the traction battery 24. The power conversion module 32 may interface with the EVSE 38 to coordinate the delivery of power to the vehicle 12. The EVSE connector 40 may have pins that mate with corresponding recesses of the charge port 34. Alternatively, various components described as being electrically connected may transfer power using a wireless inductive coupling.

The various components illustrated in FIG. 1 may have one or more associated controllers within the internal or external circuits, as well as one or more other controllers or processors to control and monitor the operation of the components. The controllers may communicate via a serial peripheral interface (SPI) bus (e.g., Controller Area Network (CAN)) or via discrete conductors. As described in greater detail below, various operating parameters or variables may be broadcast or published using the CAN or other conductors for use by vehicle control modules or sub-modules in controlling the vehicle or vehicle components, such as the traction battery pack 24. One or more controllers may operate in a stand-alone manner without communication with one or more other controllers. As described in greater detail with reference to FIGS. 2-5, one of the controllers may be implemented by a Battery Energy Control Module (BECM) 46 to control various charging and discharging functions, battery cell charge balancing, battery pack voltage measurements, individual battery cell voltage measurements, battery overcharge protection, battery over-discharge protection, battery end-of-life determination, etc. In one embodiment, the BECM 46 is programmed to publish a pack voltage based on a first internal circuit voltage in response to a voltage differential among the internal circuits being less than a threshold and based on the individual cell voltages otherwise for use in controlling the traction battery pack 24 and/or vehicle 12. The BECM 46 may be positioned within traction battery pack 24 and may communicate with various types of non-transitory computer readable storage media including persistent and temporary storage devices to store battery voltage measurements and related statistical measures of central tendency, which may include a mean, median, mode, etc. as well as various other data or mathematical results, such as a sum of voltage values, difference values, integrals, differentials, etc.

Figure 2:
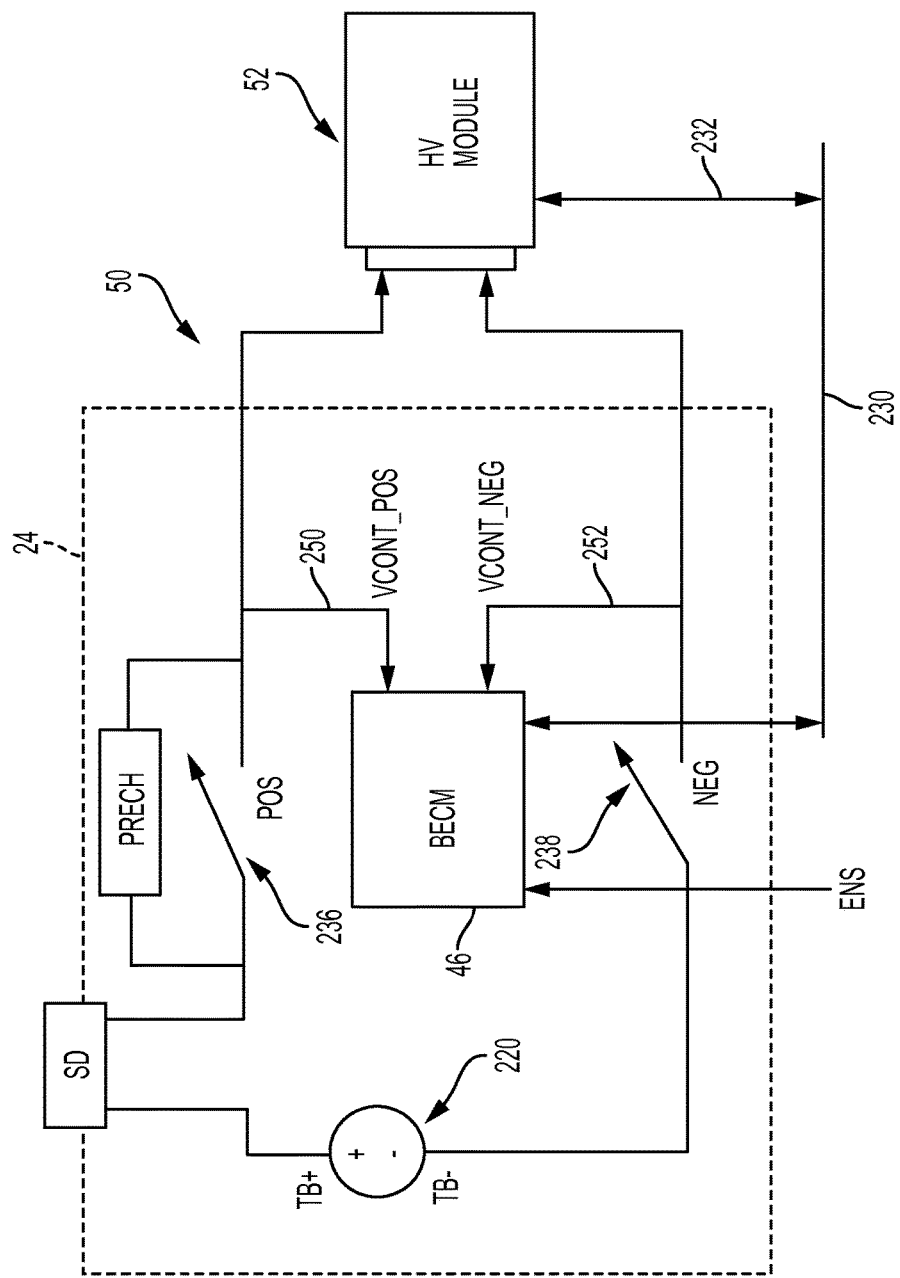
FIG. 2 is a block diagram illustrating a representative embodiment of a vehicle with representative internal and external voltage measurement circuits or modules according to embodiments of the present disclosure.

Vehicle traction battery packs may be constructed using a variety of physical arrangements or architectures and various chemical formulations. Typical battery pack chemistries include lead-acid, nickel-metal hydride (NIMH), or Lithium-Ion. FIG. 2 illustrates a typical traction battery pack 24 in a simple series configuration of a plurality of individual battery cells, generally represented at 220, and illustrated and described in greater detail with reference to FIG. 3. Battery packs may be composed of any number of individual battery cells connected in series, in parallel, or some combination thereof. As previously described, a typical system may have one or more controllers, such as BECM 46 that communicate over a vehicle network 230 via a communication link 232 to monitor and control various functions of the traction battery pack 24 and vehicle 12. The BECM 46 and/or other controllers or control modules may monitor several battery pack bulk characteristics such as battery pack current, battery pack voltage across all individual battery cells 220, battery pack temperature, and characteristics associated with individual battery cells 220. Each controller or control module may have non-volatile memory such that data may be retained when the controllers in an off condition for use after a subsequent key-on event, or may communicate data over vehicle network 230 for storage by another controller with associated non-volatile memory. Similarly, the controller(s) may include integrated non-transitory computer readable storage containing instructions for programming the controller(s) or associated processor(s) to control battery pack 24 and/or vehicle 12 that include instructions for outputting, by a vehicle processor, a pack voltage to vehicle network 230 based on internal voltage measurements within traction battery pack 24 in response to a voltage differential among the internal measurements being less than a threshold, and outputting the pack voltage based on a statistical measure or function of the internal measurements and published voltage measurements from external circuits 52 otherwise as described in greater detail with reference to FIG. 5.

With continuing reference to FIGS. 1 and 2, the BECM 46 performs many monitoring and control functions for the traction battery pack 24. For example, BECM 46 monitors the traction battery cell string 220 and controls operation of a positive main contactor 236 and a negative main contactor 238. BECM 46 communicates with one or more external high voltage modules or circuits 52 over communication links 232 to the vehicle network 230 or through some other communication bus, such as an SPI bus. In FIG. 2, only one external HV module/circuit 52 is shown, representing, for example, the inverter circuit 26, eAC circuit 27, DC/DC converter circuit 28 (all of which are shown in FIG. 1), as well as any other external circuits or modules on the high voltage bus 50 that may provide an independent measurement of the battery pack voltage and publish the voltage value on vehicle network 230 or otherwise communicate the measurement to BECM 46 or another controller for use in publishing or outputting a pack voltage as described herein.

In various embodiments, external modules or circuits 52 include circuits that measure the voltage between the VCONT_POS node 250 and the VCONT_NEG node 252. This voltage may be referred to as the DC Link voltage or alternatively, the high voltage bus voltage of the electrified vehicle 12. One or more of the external modules or circuits 52 measure this DC Link voltage and publish the number as a message on the vehicle network 230. The analog voltage of the DC Link can be measured through any appropriate circuit or device and digitized in an associated controller or microprocessor for each of the external circuits 52, and translated into an associated message for the vehicle network 230, implemented by a CAN in one embodiment. In various embodiments, the network or CAN message that includes the external measurement of the DC Link voltage by the inverter circuit 26 has a header or identifier INV_PACKV_MEAS. In a similar fashion, the CAN message that includes the independent external measurement of the DC Link voltage determined by the DC/DC converter 28 has a header or identifier DCDC_PACKV_MEAS, and the CAN message that includes the independent external measurement of the DC Link voltage determined by the eAC 27 has a header or identifier EAC_PACKV_MEAS.

As shown in FIG. 2, node or pin VCONT_POS 250 connects the high voltage or DC Link positive (+) bus node to the BECM module 46. Alternatively, the BECM 46 may be described as having a VCONT_POS pin 250. The VCONT_POS node or pin 250 is connected to an internal circuit within traction battery pack 24 and BECM 46 as shown in the upper right portion of FIG. 4 (DIV1).

As shown in FIG. 2, positive main contactor 236 and negative main contactor 238 must be closed for the pack voltage of traction battery 24 to appear on the DC Link or high voltage bus 50. If either positive main contactor 236 or negative main contactor 238 is open, the DC Link voltage will decline eventually to zero volts. However, if contactors 236, 238 are closed, then the DC Link voltage is substantially the same as the pack voltage of traction battery pack 24 because the voltage drops through the contactors 236, 238 and associated high voltage wiring are designed to be small. As such, when the contactors 236, 238 are closed, the DC Link voltage matches the pack voltage of traction battery 24. So, if the VCONT_POS node/pin 250 is configured to measure the voltage of the positive DC Link (+) with respect to the VBOT node (FIG. 4) which is the negative node or terminal of cell string 220 (also referred to as the most negative individual battery cell), then the voltage at VCONT_POS 250 is measuring the pack voltage across the individual cells of the cell string 220. Under the same operating conditions (contactors 236 and 238 closed), the DC Link voltage or high voltage bus voltage that powers external modules or circuits 52 is at the same voltage as the traction battery cell string 220. Therefore, the CAN messages published by the external circuits corresponding to independent external measurements identified by INV_PACKV_MEAS, DCDC_PACKV_MEAS, and EAC_PACKV_MEAS will provide voltage readings that will be substantially the same as the voltage of the cell string 220.

Figure 3:
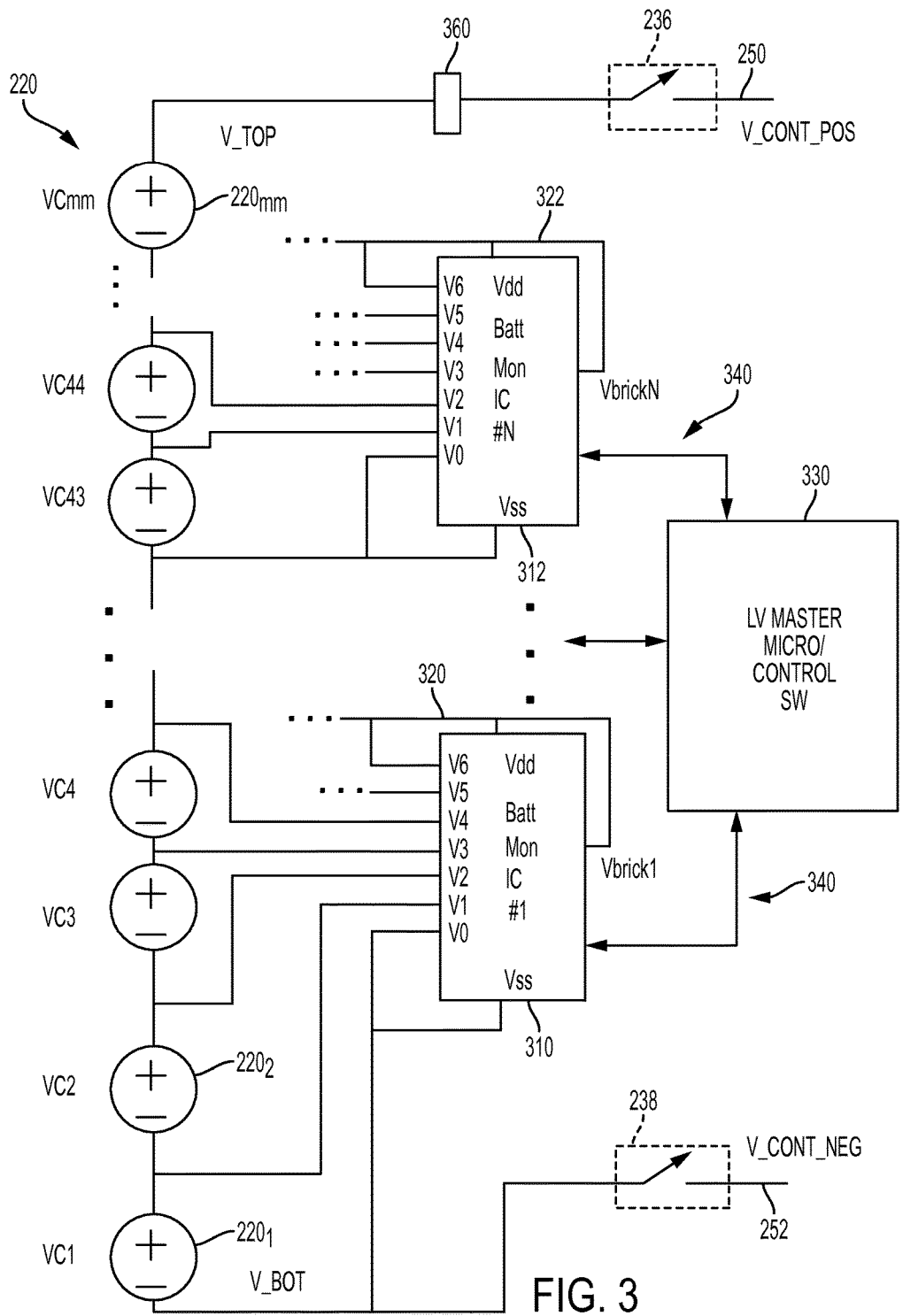
FIG. 3 is a block diagram illustrating representative internal circuits including battery cell monitor IC's for a traction battery pack for use in functional assessment and pack voltage redundancy according to embodiments of the present disclosure.

FIG. 3 is a block diagram illustrating representative internal circuits including battery cell monitor IC's for a traction battery pack for use in functional assessment and pack voltage redundancy according to embodiments of the present disclosure. Cell string 220 includes series connected cells $220_1, 220_2 \ldots 220_{mm}$ where mm represents the total the number of cells. In this arrangement, cell $220_1$ is the most negative cell and $220_{mm}$ is the most positive cell. A group, block, or brick of cells may have an associated Battery Monitor Integrated Circuit (BMIC) 310, 312. In many applications, a BMIC will only accommodate a relative small number of channels, such as 6 or 12, for example, associated with corresponding cells to provide individual cell voltages. Therefore, a number of BMIC's will be included in a typical battery pack.

As briefly described above, each individual cell in cell string 220 has its voltage measured individually by an associated BMIC 320, 312. This is accomplished using a pair of voltage sense wires connecting each cell to associated input pins, such as V0 and V1 on BMIC 310, for example. The measured pack voltage, represented by PACKV, is measured or sampled at a sample moment represented by $T_s$. The measurements of the individual cells obtained by the BMIC's 310, 312 can be synchronized in time in such a way that all cells have their voltage measured within a small duration or time window (e.g. 100 μS) around the sampling moment $T_s$. In addition, BMIC's 310, 312 may include a feature that sums the voltages of connected cells and outputs a corresponding brick voltage. As shown in the representative embodiment of FIG. 3, BMIC's 310, 312 each read six channels that provide individual cell voltages for a corresponding six cells. The associated brick voltage is provided in response to a "Brick Read" input 320, 322 associated with each BMIC 310, 312, respectively and connected as shown.

As illustrated in FIG. 3, BMIC 310 includes a Brick Read input 320 connected to the same node as the V6 input. However, the V6 input ordinarily measures the cell voltage of the cell connected between pins V5 and V6 on BMIC 310. The Brick Read input 320 reads the voltage with respect to the $V_{ss}$ pin on BMIC 310. This Brick read input captures the voltage of the group or brick of, for example, six cells that are associated with BMIC 310. In the representative embodiment of FIG. 3, a low voltage (LV) Master Micro with control software 330 communicates with each BMIC 310, 312 as generally represented by communication links 340 and controls contactors 236, 238. As such, the BMIC's 310, 312 in combination with cell string 220 and LV Master Micro 330 provide an internal circuit that provides an independent internal voltage measurement of the pack voltage. If all of the Brick read circuits on all the BMIC's are read at moments which are close in time, for instance within 100 μS around the sampling moment $T_s$, then the Brick Voltage from each BMIC 310, 312 can be added together to create the independent internal measurement of the pack voltage. A pack voltage so measured (through the Brick read circuits 320, 322) may be published to the vehicle network and/or SPI bus and may be represented by or referred to as SUM_OF_BRICK_VS. Those of ordinary skill in the art will recognize that individual cell voltages (rather than brick voltages) may also be used as an independent measurement of pack voltage for applications where a brick voltage may not be available.

Figure 4:
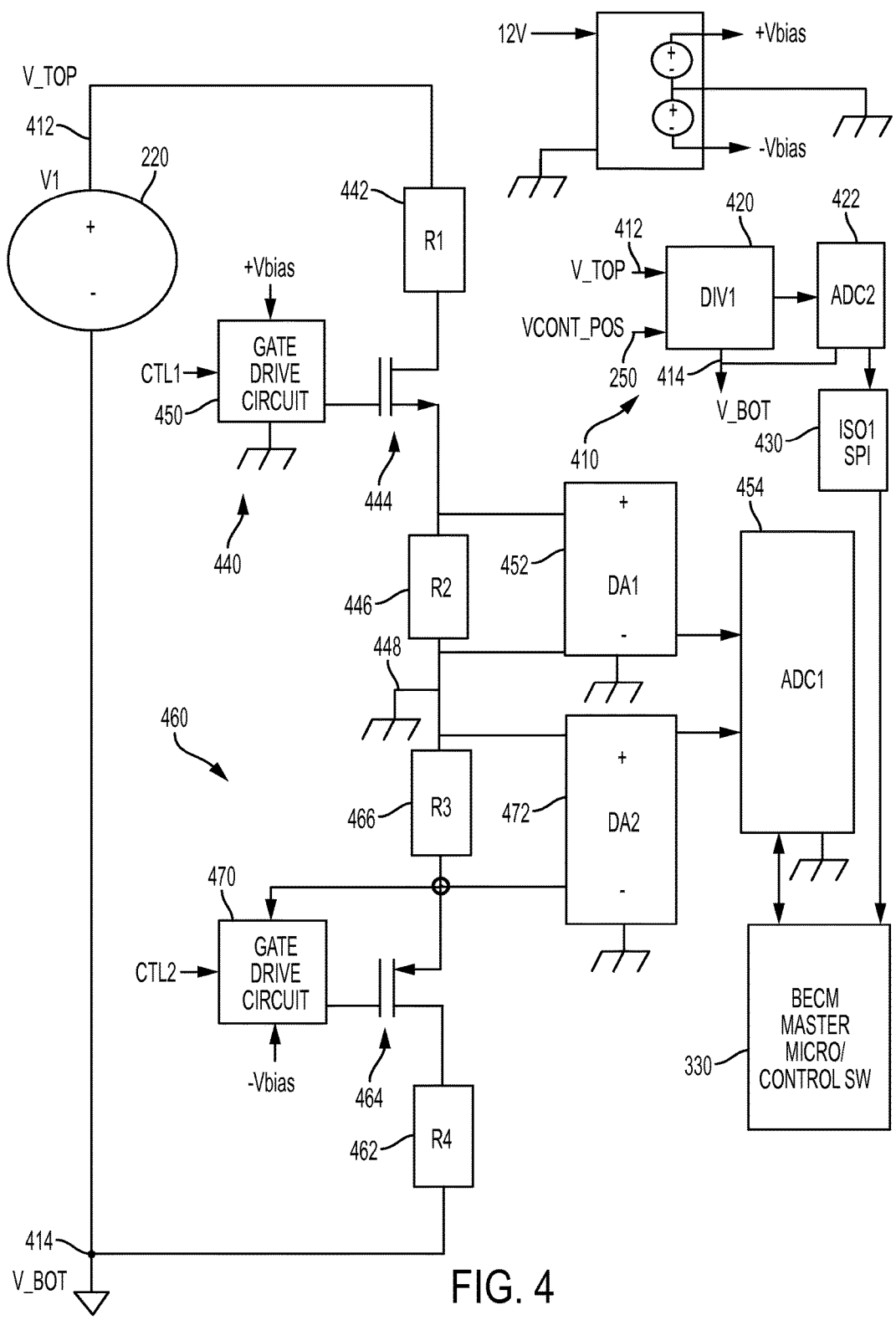
FIG. 4 is a block diagram illustrating additional representative internal circuits including leakage detection circuits for use in functional assessment and pack voltage redundancy according to embodiments of the present disclosure.

As referenced above and illustrated in the block diagram of FIG. 4, the BECM has another internal circuit that provides a measured pack voltage (PACKV). The PACKV circuit 410 includes V_TOP input 412 of divider circuit 420 (DIV1). As shown in FIGS. 3 and 4, V_TOP 412 is connected to the most positive point on the traction cell string 220. The V_BOT node 414 is the most negative point in the cell string 220. The voltage divider circuit 420 includes a reference input connected to V_BOT 414. Similarly, analog/digital converter 422 (ADC2) has a reference input connected to V_BOT 414. As such, PACV circuit 410, and more particularly voltage divider 420, provides an internal measurement of the pack voltage across the inputs connected to V_TOP and V_BOT 412, 414, respectively.

The analog voltage divider 420 contains resistors and capacitors configured to perform two functions. First, divider 420 divides or scales the pack voltage PACKV from a high voltage (e.g. 400V) to a low voltage range suitable for ADC 422. Many ADC's have an input voltage range of 0-5V or 0-3.3V, for example. If the DC transfer function of DIV1 420 is divide by 100, for example, then a 400V PACKV input is scaled down to a 4V signal appropriate for input to ADC 422. Divider 420 is also configured to implement an analog RC filter to comply with the Nyquist criterion associated with one-half of the sampling frequency. In one embodiment, analog divider 420 includes two RC sections to implement a two-pole passive analog RC filter to comply with the Nyquist criterion while digitizing or sampling the pack voltage. The scaled or divided and filtered pack voltage provided to ADC 422 is then provided to BECM master micro 330 via SPI bus connection and SPI isolator 430. This internal measurement provided by the PACKV circuit is available in digital form inside master micro 330 and is represented by PACKV_MEAS.

In one representative embodiment, the system is designed to make the PACKV_MEAS a high fidelity voltage measurement of the pack voltage that is published on the vehicle network for use in a variety of battery and vehicle control functions. The use of a high quality two pole filter in divider 420 and a high quality ADC422, combined with programming of master micro 330 to sample the pack voltage quickly enough to satisfy the Nyquist criterion, and synchronization of the sampling moments of the pack voltage via ADC 422 with other key system quantities such as pack current from current sensor 360, which also is read by master micro 330, provides a high quality or high fidelity measure pack voltage PACKV_MEAS. This voltage is designed to be the most accurate indication of the measured pack voltage. Every other representation of the pack voltage provided by external circuits as represented by INV_PACKV_MEAS, DCDC_PACKV_MEAS, and EAC_PACKV_MEAS will generally not be as accurate. In addition, pack voltage measurements provided by other internal and/or external circuits may use different filter corner frequencies and may not be synchronized in the measurement time. As such, these independent measurements of pack voltage will generally be less accurate when the pack voltage is changing rapidly (high dV/dt for the PACKV) and the correspondence between PACKV_MEAS and INV_PACKV_MEAS, DCDC_PACKV_MEAS, and EAC_PACKV_MEAS may be poor. These pack voltage measurements will have better correlation when the pack current is near zero and the pack voltage is not changing significantly over a corresponding time period.

As also illustrated by the block diagram of FIG. 4, internal pack voltage circuits may include one or more leak or leakage detection circuits. In this embodiment, the leak detection circuit includes a positive branch 440 and a negative branch 460. Positive branch 440 includes a resistor 442 (R1), a MOSFET transistor 444, and a voltage sense resistor 446 (R2), which are connected between V_TOP 412 and vehicle ground 448 (PWR_GND) or vehicle chassis reference. A gate drive circuit 450 controls the gate of MOSFET 444. Positive branch 440 also includes a differential amplifier 452 (DA1), whose output connects to a vehicle chassis referenced analog/digital converter 454 (ADC1). ADC1 454 has a communications path, ordinarily an SPI bus, that allows the BECM master micro 330 to read the analog voltages coming from DA1 452 and DA2 472, which is part of negative branch 460. Similar to positive branch 440, negative branch 460 includes a resistor 462, a MOSFET transistor 464, and a voltage sense resister 466 (R3). Transistor 464 is controlled by an associated gate drive circuit 470.

The leakage detection circuit provides detection of leakage current, but can also be used to provide an internal measurement of pack voltage through operation of the positive branch 440 and the negative branch 460. For leakage current detection, one of the switches implemented by transistors 444, 464 will be closed at any given time. To detect an undesirable leakage resistance from 448 to V_BOT 414, transistor 464 is controlled by gate drive circuit 470 so that transistor 464 is left open while gate drive circuit 450 controls transistor 444 to close for some duration, such as 1.5 seconds, for example. In this time, the voltage across sense resistor 446 stabilizes and is processed through DA1 452, and read as an analog voltage by ADC1 454. In a similar fashion, to detect an undesirable leakage resistance between PWR_GND 448 and V_TOP 412, transistor 444 is controlled to open by gate drive circuit 450 while transistor 464 is controlled to close by gate drive circuit 470. This allows any leakage indication to appear across sense resistor 466. This voltage is applied to DA2 472 and is transferred to ADC1 454, converted to digital form, and read by BECM master micro 330.

As previously described, the leakage detection circuit can be operated to provide an independent internal measurement of pack voltage. In this mode of operation, MOSFET transistors 444, 464 are simultaneously closed or on. With both transistors 444, 464 on, the resistive divider formed by resistors 442, 446, 466, and 462 may be used to determine the voltage applied from V_TOP 412 to V_BOT 414, which is the desired pack voltage. If the high fidelity PACKV_MEAS is unavailable, this mode of operation may be used to provide an alternative internal measurement of the pack voltage that may be used with one or more internal measurements and external measurements from corresponding internal and external circuits to determine a published pack voltage as described in greater detail herein. In this mode, ADC1 454 reads a first voltage across resister 446 (R2) through DA1 452, and at the same time a second voltage across resistor 466 (R3) through DA2 472. The combination or summation of the voltages from the positive branch 440 and the negative branch 460 provides a quantity that is linearly related or scaled to the pack voltage based on the values of the resistors and the operation of the differential amplifiers.

In one embodiment, the leak detection circuit operating in a pack voltage measurement mode may determine pack voltage according to:

$$LKMEAS\_PACKV=(Vr2+Vr3)*[(R1+R2+R3+R4)/(R2+R3)]$$

where Vr2 is the voltage across resistor 446 (R2), Vr3 is the voltage across resistor 466 (R3), and R1 through R4 are the resistor values of resistors 442, 446, 466, and 462, respectively. This provides an alternate measure of the pack voltage that is read through a different hardware path than that of PACKV_MEAS to provide an independent internal circuit measurement of the pack voltage. Being independent from the circuit used to provide PACKV_MEAS allows use of the leak detection circuit to provide a redundant backup measurement if PACKV_MEAS is unavailable or the functional assessment or self-diagnosis indicates that PACKV_MEAS is inaccurate or unreliable.

With reference to FIG. 3, another internal circuit that may be used to provide an independent internal measurement of pack voltage is shown. Similar to the use of the brick voltages previously described, individual cell voltages of the cells $220_1$ through $220_{mm}$ can be summed or combined to provide a pack voltage measurement. The BMIC's 310, 312 measure the cell voltages with a relatively long period or sample interval such as 100 mS such that each cell is measured once in a 100 mS period, for example. The BMIC readings of the cell voltages have excellent redundancy, which makes it relatively easy to self-check the consistency of the BMIC inputs. Under normal operating conditions, the cell voltages of each of the cells are substantially equal, varying by less than a few millivolts. While the cells may occasionally become unbalanced and vary by more than the typical value, the BMIC's 310, 312 monitor the cell voltages and periodically rebalance the cells. Individual battery cell voltage variation may be represented by $\Delta V$, obtained by measuring all of the cell voltages at a moment in time $T_s$. The processor of master micro 330 is programmed to determine a maximum cell voltage, denoted by Vmax and a minimum voltage denoted by Vmin, with the difference represented by $\Delta V=Vmax-Vmin$.

The BMIC's 310, 312 may include a number of self-diagnosis and other features that may set a flag or other indicator when abnormal operation is detected. These features are not described in detail here. However, function descriptions are readily available in product literature associated with commercially available BMIC's, such as the Analog Devices AD7280, for example.

The most reliable and redundant indication of the pack voltage available other than PACKV_MEAS in the BECM 46 will be the sum of individual cell voltages obtained from BMIC's 310, 312 at a time when the self-diagnosis features of the BMIC's indicate no faults (meaning no IC failures and as well, no open wires to the BECM module, which is also detected by the BMIC's 310, 312) and when the $\Delta V$ as indicated above is below a corresponding threshold represented by MIN_ACCEPTABLE_DELTA_V, which may be 50 mV, for example. Stated differently, when:

BMIC's 310, 312 indicate no self diagnosis faults or external faults AND $\Delta V<$MIN_ACCEPTABLE_DELTA_V then the pack voltage provided by the internal circuit associated with the sum of individual cell voltages is a highly trustworthy indication of the pack voltage and is represented by SUM_OF_CELLS_RELIABLE. This variable could be VALID or INVALID depending on whether the conditions above are satisfied. This value is sampled relatively slowly (e.g. 100 mS) so while it is a reliable indication of the pack voltage, it will not be as accurate as the high fidelity version provided by PACKV_MEAS. However, it is generally the most useful pack voltage measurement for backup purposes, particularly when voltage varies slowly.

In various embodiments, PACKV_MEAS readings (from the PACKV circuit) are made every 2 mS or every 10 mS, for example. Pack voltage is read much faster than the cell voltage because the PACKV is used for power calculations for the pack, by multiplying PACKV_MEAS by the pack current from current sensor 360 to obtain an instantaneous power. As previously described, the system was designed to provide a high fidelity reading of PACKV synchronized in time with the pack current reading by master micro 330. Since the PACKV voltage and associated current quantities are synchronized, the two numbers can be directly multiplied to obtain a valid instantaneous power figure for the battery pack 24.

The following signals, variables, or messages provide independent internal measurements of the pack voltage as previously described and will ideally be the same value: VCONT_POS_MEAS, PACKV_MEAS, and SUM_OF_CELLS_RELIABLE. Similarly, the following signals, variables, or messages provide independent external measurements of the pack voltage as previously described and will ideally be the same value: INV_PACKV_MEAS, DCDC_PACKV_MEAS, and EAC_PACKV_MEAS. Each internal and external measurement has an associated flag or indicator that is set to VALID and changed to INVALID if it is either out of range, has an internal failure, or if it is at a time when the reading cannot be compared to the other circuit measurements of pack voltage. For instance, if the pack current is much larger than zero, then the pack voltage will be changing in time due to the Equivalent Series Resistance (ESR) of the cells. Therefore, the functional assessments described herein may not run at all times, but rather only when the contactors 236, 238 (FIG. 2) are closed and the pack current is near zero. At other times (when for instance contactors are open or the pack current is more than a threshold, such as 1 A) then the BECM 46 will use the same configuration as when all valid readings were available.

The signal, variable, or message represented by DELTA_INTERNAL_TRIAD has an associated flag set to VALID if the internal circuit measurements (VCONT_POS_MEAS, PACKV_MEAS, SUM_OF_CELLS_RELIABLE) flags are VALID. The Master Micro 330 will mark these flags as VALID if the circuits have no internal faults and the signals are IN RANGE. The signals are IN RANGE if the values are within a predetermined calibratable range, which is based on expected values during operation. Master Micro 330 will mark a signal flag as INVALID if there is an internal module fault for the given circuit, or if the given signal is OUT OF RANGE. DELTA_INTERNAL_TRIAD represents the voltage difference among all of the pack voltage measurements by the internal circuits and is given by:

DELTA_INTERNAL_TRIAD=MAX(*VCONT_POS_MEAS*,PACK*V_MEAS*,SUM_OF_CELLS_RELIABLE)-MIN(*VCONT_POS_MEAS*,PACK*V_MEAS*,SUM_OF_CELLS_RELIABLE)

where MAX is a function that selects the maximum value of the parenthetical variables and MIN is a function that selects the minimum value of the parenthetical variables.

As such, DELTA_INTERNAL_TRIAD provides a measure of the variation among the internal circuits in the BECM which provide independent internal measurements of pack voltage. As previously described, VCONT_POS_MEAS uses the input circuit from DIV1 420 with the V_CONT_POS input 250, referenced to V_BOT 414 to measure the DC_LINK or pack voltage. At a time when the contactors 236, 238 are closed, VCONT_POS_MEAS provides a reading that reads about the same as the pack voltage. PACKV_MEAS is the high fidelity pack voltage reading from the pack voltage read circuit in DIV1 420 that measures the voltage between V_TOP 412 and V_BOT 414. The SUM_OF_CELLS_RELIABLE is provided by the BMICs 310,312 and is valid under the conditions described above. If DELTA_INTERNAL_TRIAD<THRESHOLD_DELTA_INTERNAL_TRIAD, then the internal BECM circuits VCONT_POS_MEAS, PACKV_MEAS, and SUM_OF_CELLS_RELIABLE are considered reliable. Otherwise, one or more of the internal variables is inaccurate and further steps need to be taken to ascertain a reliable pack voltage reading. In one embodiment, THRESHOLD_DELTA_INTERNAL_TRIAD corresponds to 20V, for example.

In a similar manner, DELTA_EXTERNAL_TRIAD provides a measure of the variation among the external circuits that provide independent external measurements of pack voltage and is determined according to:

DELTA_EXTERNAL_TRIAD=MAX(*INV_PACKV_MEAS,DCDC_PACKV_MEAS,EAC_PACKV_MEAS*)−MIN(*INV_PACKV_MEAS,DCDC_PACKV_MEAS,EAC_PACKV_MEAS*)

where INV_PACKV_MEAS represents the external measurement of pack voltage determined by the inverter circuit 26, DCDC_PACKV_MEAS represents the external measurement of pack voltage determined by the DC/DC converter circuit 28, and EAC_PACKV_MEAS represents the external measurement of pack voltage determined by the eAC circuit 27. If DELTA_EXTERNAL_TRIAD<THRESHOLD_DELTA_EXTERNAL_TRIAD, then the external measurements represented by INV_PACKV_MEAS, DCDC_PACKV_MEAS, EAC_PACKV_MEASE are all considered reliable. Otherwise, one or more of these external measurements is considered inaccurate and further steps need to be taken to ascertain a reliable reading. In one embodiment THRESHOLD_DELTA_EXTERNAL_TRIAD corresponds to 20V, for example.

BECM 46 may publish a pack voltage to the vehicle network 230 based on a statistical measure of central tendency, such as a mean, median, or mode, of the independent internal and external measurements. In one embodiment, a median pack voltage is determined according to:

MEDIAN_PACKV=MEDIAN(*VCONT_POS_MEAS, PACKV_MEAS,SUM_OF_CELLS_RELIABLE, INV_PACKV_MEAS,DCDC_PACKV_MEAS, EAC_PACKV_MEAS*)

NOTE: Before performing this MEDIAN function, any of the elements such as VCONT_POS_MEAS, PACKV_MEAS, etc. which are INVALID are removed from the calculation. Therefore, this MEDIAN function operates on a list of values which are all VALID.

where the MEDIAN function is a statistical measure that determines the median of the parenthetical values by sorting or ordering the values from lowest to highest, and taking the average or mean of the two middle values in the ordered data set. Use of the median pack voltage in response to conditions specified below will reject input signals that are anomalous or out of range and can remain unaffected if two of the six inputs are erroneously low or high.

Another variable, signal, or message is represented by RELIABLE_PACKV according to:
SWITCH (CASE)
{
  CASE((PACKV_MEAS is VALID) ANDAND ((DELTA_INTERNAL_TRIAD is VALID) AND
  (DELTA_INTERNAL_TRIAD < THRESHOLD_DELTA_INTERNAL_TRIAD))):
    {RELIABLE_PACKV=PACKV_MEAS};
  BREAK;
  CASE (SUM_OF_CELLS_RELIABLE is VALID):
    RELIABLE_PACKV=SUM_OF_CELLS_RELIABLE;
  BREAK;
  CASE(((DELTA_EXTERNAL_TRIAD is VALID) AND (DELTA_EXTERNAL_TRIAD<THRESHOLD_DELTA_EXTERNAL_TRIAD))):
    {RELIABLE_PACKV=MEDIAN_PACKV}
  BREAK;
  default:
    {RELIABLE_PACKV=DTC_FLAG}
}

Operation of the above logic or method executed by a programmed processor or computer, such as BECM 46 proceeds as follows. If the DELTA_INTERNAL_TRIAD is trustworthy (lower than the threshold of 20V in this representative example), then PACKV_MEAS is indicated as reliable and is published as the pack voltage to the vehicle network 230. If not, SUM_OF_CELLS_RELIABLE is the next most reliable indication and it is used. However, if one or the other of PACKV_MEAS or SUM_OF_CELLS_RELIABLE are invalid, then the system may not be able to determine which one is correct and then uses the MEDIAN_PACKV measure, which is the next most reliable indication of the pack voltage, unless DELTA_EXTERNAL_TRIAD exceeds its associated threshold, in which case a diagnostic code (DTC) or associated flag is set and a default value or last know valid value of pack voltage may be used.

Figure 5:
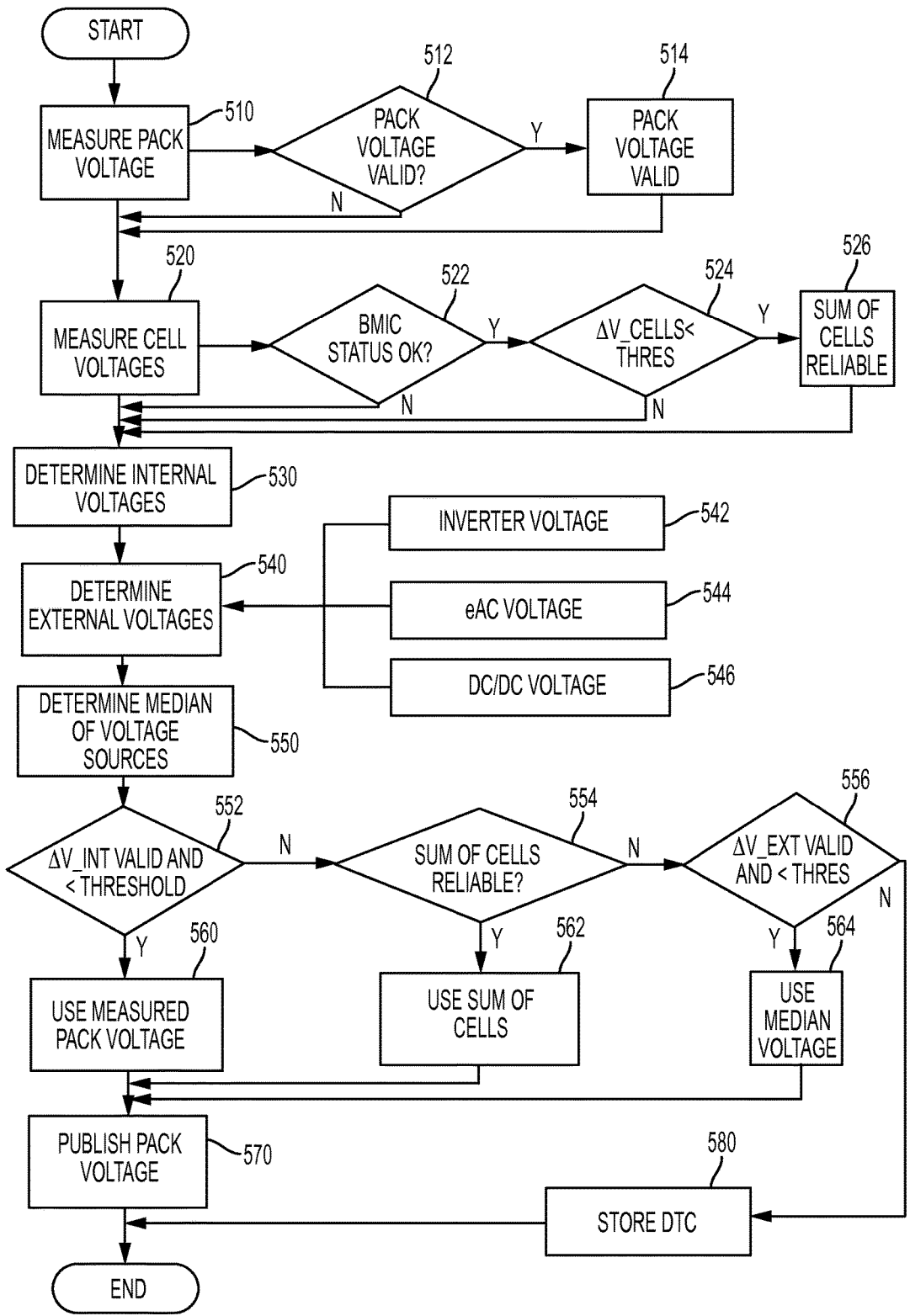
FIG. 5 is a block diagram illustrating operation of a system or method for controlling an electric vehicle including outputting or publishing a pack voltage based on voltage measurements from internal and/or external circuits according to embodiments of the present disclosure.

Referring now to FIG. 5, a block diagram illustrating operation of a system or method for controlling an electric vehicle including performing a functional assessment and publishing a pack voltage based on at least one of an internal measurement and an external measurement in response to the functional assessment. With regard to the processes, systems, methods, heuristics, etc. described herein, it should be understood that, although the steps of such processes, etc. may be described as occurring in an ordered sequence, such processes could be performed with the described steps completed in an order other than the order described herein. It should also be understood that certain steps could be performed simultaneously, that other steps could be added, or that certain steps described herein could be omitted while keeping with the teachings of this disclosure and being encompassed by the claimed subject matter. In other words, the descriptions of methods or processes are provided for the purpose of illustrating certain embodiments, and should be understood to be representative of one of many variations and not limited to only those shown or described.

The block diagram of FIG. 5 provides an alternative representation of operation of various embodiments according to the disclosure, similar to those already described. In block 510, a pack voltage measurement is obtained from an associated internal circuit, such as PACKV, for example. The particular internal circuit used to provide the pack voltage measurement may vary by application and implementation. The pack voltage measurement could be obtained from an external circuit provided the system is designed to provide a high fidelity pack voltage measurement. In most applications, the more accurate or higher fidelity indication of the pack voltage will be provided by one or more internal circuits within the battery pack and/or battery controller. A self-diagnosis of the circuit providing the pack voltage measurement is performed as represented at 512 with a corresponding flag or status indicator set at 514 if no faults or out of range indications are identified at 512. Otherwise, the flag or status indicator maybe set to INVALID or UNRELIABLE, for example.

A second independent internal circuit may be used to measure individual cell voltages or voltage across one or more groups or bricks of individual cells as represented at 520. In one embodiment, the individual cell voltage circuit includes BMIC's associated with groups or bricks of cells as previously described, with the BMIC's performing various self-diagnosis functions as represented at block 522. A voltage difference or differential among individual cells or bricks may be compared to an associated threshold as represented at 524 as an additional functional assessment of the related components and cells in the circuit. If blocks 522 and 524 do not detect any errors or other anomalous operation, a corresponding flag or status indicator is set or stored as represented by block 526 to indicate that the sum of individual cell voltages is reliable.

Other internal measurements of the pack voltage determined by corresponding independent internal circuits may be performed as previously described and generally represented by block 530. For example, block 530 may determine pack voltage by appropriate control and operation of the transistors and/or contactors associated with a leakage detection circuit as previously described with reference to FIG. 4.

As also illustrated in FIG. 5, one or more external circuits provide corresponding independent external measurements of the pack voltage as represented at block 540. In one embodiment, independent external measurements of pack voltage are provided from an inverter module or circuit as represented at 542, an eAC module or circuit as represented at 544, and a DC/DC converter module or circuit as represented at 546. One or more external modules or circuits may provide an external measurement of pack voltage by outputting or publishing a corresponding signal or message to a vehicle network. Some or all of the external modules or circuits may also include self-diagnosis functions and associated status indicators or flags that are not explicitly illustrated. Block 550 then determines a median of the valid internal and external voltage sources.

Block 552 compares the voltage difference among all of the internal measurements to an associated threshold. If the voltage difference is less than the associated threshold as indicated at 552, then the measured pack voltage is used as indicated at 560 and is published to the vehicle network as represented at 570 for use by one or more controllers to control the battery pack and/or vehicle. If the voltage difference among all of the internal voltage measurements exceeds the associated threshold as indicated at 552, then the status indicator or flag associated with the internal measurement of the individual cells is checked as represented at 554. If the internal circuit(s) associated with the individual cells or groups of cells indicates a reliable reading as previously described, then the pack voltage uses the sum of cells measurement as indicated at 562 and the published pack voltage 570 corresponds to the value determined by the sum of individual cells.

If the sum of cell voltages is not indicated as reliable, then block 556 determines whether a voltage difference among all of the external measurements of pack voltage exceeds a corresponding threshold. If the voltage difference is less than the associated threshold, then a statistical measure or function is used to determine the published pack voltage. In the embodiment illustrated, block 564 determines a median voltage of the internal measurements and external measurements for the published pack voltage, which is then output or published to the vehicle network as indicated at 570. If the voltage difference exceeds the corresponding threshold as indicated at 556, then a diagnostic code (DTC) may be stored as indicated at 580 and the published pack voltage may revert to a previous value or may be modeled or estimated by some other method.

As illustrated in FIG. 5, a controller in communication with the internal circuits and the external circuits is programmed to publish a pack voltage to the vehicle network. The pack voltage corresponds to a first independent internal measurement at 560 in response to a voltage differential among all of the independent internal measurements being less than a threshold at 552, a second independent internal measurement at 562 in response to the voltage differential exceeding the threshold at 552, and a statistical measure of the independent internal and external measurements at 564 in response to any of the internal measurements being invalid at 552, 554. The controller may be further programmed to store a diagnostic code in an associated non-transitory storage medium at 580 in response to the voltage differential being above the threshold at 552, and a second voltage differential among all of the independent external measurements exceeding an associated threshold at 556. The controller is further programmed to publish the pack voltage at 570 corresponding to the statistical measure at 564, unless a second voltage differential among all of the independent external measurements exceeds an associated threshold at 556.

As such, embodiments according to the present disclosure may provide one or more advantages, such as performing a functional assessment and self-diagnosis of the validity of battery pack voltage measurements using measurements from internal and/or external circuits. In addition, embodiments may provide a reliable indication of battery pack voltage when the functional assessment indicates one or more of the internal or external circuits are not functioning as expected. Various embodiments provide self-diagnosis using the functional assessments described herein in combination with redundancy to provide a backup battery voltage measurement for use in controlling the battery and/or vehicle.

While representative embodiments are described above, it is not intended that these embodiments describe all possible embodiments within the scope of the disclosure or claimed subject matter. The words used in the specification are words of description rather than limitation, and it is understood that various changes may be made without departing from the spirit and scope of the disclosure. Additionally, the features of various embodiments may be combined to form further embodiment even though particular combinations are not explicitly described or illustrated. Various embodiments may have been described as providing advantages or being preferred over other embodiments or prior art implementations with respect to one or more desired characteristics. However, as one of ordinary skill in the art is aware, one or more features or characteristics may be compromised to achieve desired overall system attributes, which depend on the specific application and implementation. These attributes may include, but are not limited to: cost, strength, security, durability, life cycle cost, marketability, appearance, packaging, size, serviceability, weight, manufacturability, ease of assembly, etc. Embodiments described as less desirable than other embodiments or prior art implementations with respect to one or more characteristics are not outside the scope of the disclosure or claims and may be desirable for particular applications.

What is claimed is:

1. A vehicle, comprising:
 a traction battery pack having a high voltage bus and a plurality of individual battery cells, the traction battery pack including a plurality of internal circuits that provides a corresponding plurality of independent internal measurements of traction battery pack voltage;
 a plurality of external circuits external to the traction battery pack and coupled to the high voltage bus providing a corresponding plurality of independent external measurements of the traction battery pack voltage;
 an electric machine powered by the traction battery pack via one of the plurality of external circuits to propel the vehicle; and
 a controller in communication with the plurality of internal circuits and the plurality of external circuits and programmed to publish a pack voltage to a vehicle network, the pack voltage corresponding to a first independent internal measurement in response to a voltage differential among all of the independent internal measurements being less than a threshold, a second independent internal measurement in response to the voltage differential exceeding the threshold, and a statistical measure of the independent internal and external measurements in response to any of the internal measurements being invalid.

2. The vehicle of claim 1, the plurality of external circuits comprising:
 an inverter circuit;
 an electric air conditioning (eAC) circuit; and
 a DC/DC converter circuit.

3. The vehicle of claim 1, the plurality of internal circuits comprising a battery pack voltage measuring circuit that measures traction battery pack voltage across the plurality of individual battery cells.

4. The vehicle of claim 1, the plurality of internal circuits comprising a plurality of battery monitoring integrated circuits each measuring voltage across a corresponding group of the individual battery cells.

5. The vehicle of claim 4, the controller further programmed to combine voltages from the plurality of battery monitoring integrated circuits to determine one of the plurality of independent internal measurements of the traction battery pack voltage.

6. The vehicle of claim 1, each of the plurality of external circuits publishing a corresponding one of the plurality of independent external measurements to the vehicle network.

7. The vehicle of claim 1, the plurality of internal circuits comprising:
 a positive branch leakage detection circuit measuring the traction battery pack voltage from a most positive of the individual battery cells to vehicle ground; and
 a negative branch leakage detection circuit measuring the traction battery pack voltage from a most negative of the individual battery cells to vehicle ground.

8. The vehicle of claim 7, one of the plurality of independent internal measurements being based on voltage across the positive and negative branch leakage detection circuits.

9. The vehicle of claim 1, the statistical measure comprising a median value of the internal and external measurements.

10. The vehicle of claim 1, the controller further programmed to store a diagnostic code in an associated non-transitory storage medium in response to the voltage differential being above the threshold and a second voltage differential among all of the independent external measurements exceeding an associated threshold.

11. A vehicle comprising:
 a battery having internal circuits that measure pack voltage and individual cell voltages;
 an electric machine powered by the battery to propel the vehicle via an external circuit that measures the pack voltage; and
 a processor programmed to publish the pack voltage based on a first internal circuit voltage in response to a voltage differential among the internal circuits being less than a threshold and based on the individual cell voltages otherwise.

12. The vehicle of claim 11 further comprising a second external circuit that measures the pack voltage, the processor further programmed to publish the pack voltage based on a statistical measure of central tendency of the pack voltage measurements from the internal circuits and the external circuits.

13. The vehicle of claim 12, the processor programmed to store a diagnostic code in response to a voltage difference among the external circuits exceeding a second threshold.

14. The vehicle of claim 12, the processor programmed to publish the pack voltage based on a median value of the pack voltage measurements from the internal circuits and the external circuits in response to a voltage difference among the external circuits being below the second threshold.

15. The vehicle of claim 12, the second external circuit comprising one of an electric air conditioning (eAC) circuit and a DC/DC converter circuit.

16. The vehicle of claim 11, the external circuit publishing a pack voltage measurement to a vehicle network.

17. A control method for an electric vehicle having a traction battery coupled to an electric machine, comprising:
 outputting, by a vehicle processor, a pack voltage to a vehicle network, the pack voltage based on internal voltage measurements in response to a voltage differential among the internal voltage measurements being less than a threshold, and
 based on a statistical function of both the internal voltage measurements and published voltage measurements from external circuits otherwise.

18. The control method of claim 17, wherein the internal voltage measurements used in the statistical function comprise an internal voltage measurement obtained by summing of internal measurements associated with individual battery cells.

19. The control method of claim 17, wherein the pack voltage is based on a median of the internal voltage measurements and the published voltage measurements from the external circuits in response to a voltage differential of the published voltage measurements from the external circuits being below an associated threshold.

* * * * *